(12) United States Patent
Zhao et al.

(10) Patent No.: US 12,230,646 B2
(45) Date of Patent: Feb. 18, 2025

(54) ARRAY SUBSTRATE AND DISPLAY PANEL

(71) Applicant: Guangzhou China Star Optoelectronics Semiconductor Display Technology Co., Ltd., Guangzhou (CN)

(72) Inventors: Jun Zhao, Guangzhou (CN); Bin Zhao, Guangzhou (CN); Juncheng Xiao, Guangzhou (CN); Shan Li, Guangzhou (CN); Wei Wu, Guangzhou (CN)

(73) Assignee: Guangzhou China Star Optoelectronics Semiconductor Display Technology Co., Ltd., Guangzhou (CN)

(*) Notice: Subject to any disclaimer, the term of this patent is extended or adjusted under 35 U.S.C. 154(b) by 0 days.

(21) Appl. No.: 17/777,034

(22) PCT Filed: Apr. 14, 2022

(86) PCT No.: PCT/CN2022/086790
§ 371 (c)(1),
(2) Date: May 15, 2022

(87) PCT Pub. No.: WO2023/184587
PCT Pub. Date: Oct. 5, 2023

(65) Prior Publication Data
US 2024/0162248 A1 May 16, 2024

(30) Foreign Application Priority Data
Mar. 29, 2022 (CN) .................. 202210318330.X

(51) Int. Cl.
*H01L 27/12* (2006.01)
(52) U.S. Cl.
CPC .................. *H01L 27/1248* (2013.01)

(58) Field of Classification Search
CPC ............ H01L 27/1248; H01L 27/1225; H01L 27/1222; H01L 27/1237; H01L 29/7869; H01L 29/517
See application file for complete search history.

(56) References Cited

U.S. PATENT DOCUMENTS

| 2012/0001169 A1 | 1/2012 | Yamazaki |
| 2015/0001533 A1* | 1/2015 | Kuwabara ............... H01L 29/04 257/43 |
| 2024/0250178 A1* | 7/2024 | He ..................... H01L 29/7869 |

FOREIGN PATENT DOCUMENTS

| CN | 102891183 A | 1/2013 |
| CN | 105655291 A | 6/2016 |

(Continued)

OTHER PUBLICATIONS

International Search Report in International application No. PCT/CN2022/086790, mailed on Dec. 15, 2022.

(Continued)

*Primary Examiner* — Shaun M Campbell
(74) *Attorney, Agent, or Firm* — Nathan & Associates; Menachem Nathan

(57) ABSTRACT

An array substrate and a display panel are provided. The array substrate includes a substrate, a gate, a gate insulating layer, an oxide semiconductor layer, and a source-drain metal layer. Material of at least a portion of the gate insulating layer in contact with the oxide semiconductor layer and material of the oxide semiconductor layer include an oxide of the first metal element. Thus, a transition interface between the gate insulating layer and the oxide semiconductor layer has a lower density of defect states, which is beneficial to improve mobility and stability.

17 Claims, 4 Drawing Sheets

(56) References Cited

FOREIGN PATENT DOCUMENTS

| CN | 105679833 A | 6/2016 |
|---|---|---|
| CN | 106847932 A | 6/2017 |
| CN | 106887436 A | 6/2017 |
| CN | 108461403 A | 8/2018 |
| CN | 114122014 A | 3/2022 |

OTHER PUBLICATIONS

Written Opinion of the International Search Authority in International application No. PCT/CN2022/086790, mailed on Dec. 15, 2022.

* cited by examiner

ARRAY SUBSTRATE AND DISPLAY PANEL

FIELD OF DISCLOSURE

The present disclosure relates to the field of display technologies, in particular to an array substrate and a display panel.

BACKGROUND

With the development of display panels in a direction of large size, high resolution, high frequency, and self-luminous display mode, higher and higher requirements are put forward for a mobility and stability of thin film transistors that control switches and drive displays. A mobility of metal oxide thin film transistors is as high as 10 to 100 times that of amorphous silicon thin film transistors. However, compared with low temperature polysilicon thin film transistors, the metal oxide thin film transistors still have low mobility and poor stability.

SUMMARY OF DISCLOSURE

Embodiments of the present disclosure provide an array substrate and a display panel to solve technical problems of low mobility and poor stability in existing metal oxide thin film transistors.

The present disclosure provides an array substrate including a substrate, a gate, a gate insulating layer, an oxide semiconductor layer, and a source-drain metal layer. The gate, the gate insulating layer, the oxide semiconductor layer, and the source-drain metal layer are disposed on the substrate, the gate insulating layer is disposed between the gate and the oxide semiconductor layer. The gate, the gate insulating layer, the oxide semiconductor layer, and the source-drain metal layer are sequentially stacked in a direction away from the substrate.

Material of the oxide semiconductor layer includes an oxide of a first metal element, material of at least a portion of the gate insulating layer in contact with the oxide semiconductor layer includes the oxide of the first metal element, and the first metal element includes one of aluminum, hafnium, titanium, zirconium, praseodymium, and lanthanum.

According to the array substrate of the present disclosure, material of all portions of the gate insulating layer is the oxide of the first metal element.

According to the array substrate of the present disclosure, the gate insulating layer includes a first sub-layer and a second sub-layer connected to each other, the first sub-layer is disposed on a side of the gate close to the oxide semiconductor layer, the second sub-layer is disposed between the oxide semiconductor layer and the first sub-layer, and an orthographic projection of the second sub-layer on the substrate covers an orthographic projection of the oxide semiconductor layer on the substrate.

Material of the first sub-layer is different from material of the second sub-layer, and the material of the second sub-layer is the oxide of the first metal element.

According to the array substrate of the present disclosure, the first sub-layer includes a recess formed on a side of the first sub-layer away from the substrate, at least a portion of the recess is arranged corresponding to the oxide semiconductor layer, and the second sub-layer is filled in the recess.

According to the array substrate of the present disclosure, the oxide semiconductor layer is disposed on a side of at least a portion of the first sub-layer away from the substrate.

According to the array substrate of the present disclosure, the material of the first sub-layer includes at least one of silicon nitride, silicon oxide, and silicon oxynitride.

According to the array substrate of the present disclosure, a thickness of the second sub-layer ranges from 5 nanometers to 1 micrometer.

The present disclosure provides an array substrate including a substrate, a gate, a gate insulating layer, an oxide semiconductor layer, and a source-drain metal layer. The gate, the gate insulating layer, the oxide semiconductor layer, and the source-drain metal layer are disposed on the substrate, and the gate insulating layer is disposed between the gate and the oxide semiconductor layer.

Material of the oxide semiconductor layer includes an oxide of a first metal element, and material of at least a portion of the gate insulating layer in contact with the oxide semiconductor layer includes the oxide of the first metal element.

According to the array substrate of the present disclosure, material of all portions of the gate insulating layer is the oxide of the first metal element.

According to the array substrate of the present disclosure, the gate insulating layer includes a first sub-layer and a second sub-layer connected to each other, the first sub-layer is disposed on a side of the gate close to the oxide semiconductor layer, the second sub-layer is disposed between the oxide semiconductor layer and the first sub-layer, and an orthographic projection of the second sub-layer on the substrate covers an orthographic projection of the oxide semiconductor layer on the substrate.

Material of the first sub-layer is different from material of the second sub-layer, and the material of the second sub-layer is the oxide of the first metal element.

According to the array substrate of the present disclosure, the first sub-layer includes a recess formed on a side of the first sub-layer away from the substrate, at least a portion of the recess is arranged corresponding to the oxide semiconductor layer, and the second sub-layer is filled in the recess.

According to the array substrate of the present disclosure, the oxide semiconductor layer is disposed on a side of at least a portion of the first sub-layer away from the substrate.

According to the array substrate of the present disclosure, the material of the first sub-layer includes at least one of silicon nitride, silicon oxide, and silicon oxynitride.

According to the array substrate of the present disclosure, a thickness of the second sub-layer ranges from 5 nanometers to 1 micrometer.

According to the array substrate of the present disclosure, the first metal element includes one of aluminum, hafnium, titanium, zirconium, praseodymium, and lanthanum.

According to the array substrate of the present disclosure, the oxide semiconductor layer further includes an oxide of a second metal element and an oxide of a third metal element, the first metal element, the second metal element, and the third metal element are different metal elements.

The second metal element is one of indium, gallium, zinc, and tin, and the third metal element is one of indium, gallium, zinc, and tin.

According to the array substrate of the present disclosure, the first metal element is aluminum (Al), the second metal element is gallium (Ga), and the third metal element is zinc (Zn); and wherein molar contents of the aluminum (Al), the gallium (Ga), and the zinc (Zn) satisfy following relationships:

$$0.1 \leq Al/(Al+Ga+Zn) \leq 0.5;$$

$$0.2 \leq Ga/(Al+Ga+Zn) \leq 0.4;$$

$0.3 \leq Zn/(Al+Ga+Zn) \leq 0.5$.

According to the array substrate of the present disclosure, the gate, the gate insulating layer, the oxide semiconductor layer, and the source-drain metal layer are sequentially stacked in a direction away from the substrate. Alternatively, the oxide semiconductor layer, the gate insulating layer, the gate, and the source-drain metal layer are sequentially stacked in the direction away from the substrate.

According to the array substrate of the present disclosure, the array substrate further includes:
- a passivation layer covering a side of the source-drain metal layer away from the substrate; and
- a pixel electrode disposed on a side of the passivation layer away from the substrate, wherein the pixel electrode is electrically connected to the source-drain metal layer through a via hole extending through the passivation layer.

The present disclosure provides a display panel, including an opposite substrate and an array substrate, and the opposite substrate is relatively spaced apart from the array substrate; and The array substrate includes a substrate, a gate, a gate insulating layer, an oxide semiconductor layer, and a source-drain metal layer. The gate, the gate insulating layer, the oxide semiconductor layer, and the source-drain metal layer are disposed on the substrate, and the gate insulating layer is disposed between the gate and the oxide semiconductor layer. Material of the oxide semiconductor layer includes an oxide of a first metal element, and material of at least a portion of the gate insulating layer in contact with the oxide semiconductor layer includes the oxide of the first metal element.

In order to solve the above problems, the technical solutions provided by the present disclosure are as follows.

Advantages of the present disclosure are as follows. In the array substrate and the display panel of the present disclosure, the material of the oxide semiconductor layer includes the oxide of the first metal element, and the material of at least the portion of the gate insulating layer in contact with the oxide semiconductor layer includes the oxide of the first metal element. Since the gate insulating layer and the oxide semiconductor layer have the same composition at a transition interface therebetween, the transition interface has a lower density of defect states. In the prior art, since the gate insulating layer and the oxide semiconductor layer have different materials, direct contact between the two causes many defect states at the transition interface. The above situation is prevented, which is beneficial to improve the mobility and stability of the thin film transistor.

BRIEF DESCRIPTION OF DRAWINGS

In order to illustrate technical solutions of the embodiments of the present disclosure more clearly, the following briefly introduces accompanying drawings used in the description of the embodiments. Obviously, the drawings in the following description are only some examples of the present disclosure. For those skilled in the art, other drawings can also be obtained from these drawings without creative efforts.

REFERENCE NUMERALS

Figure 1:
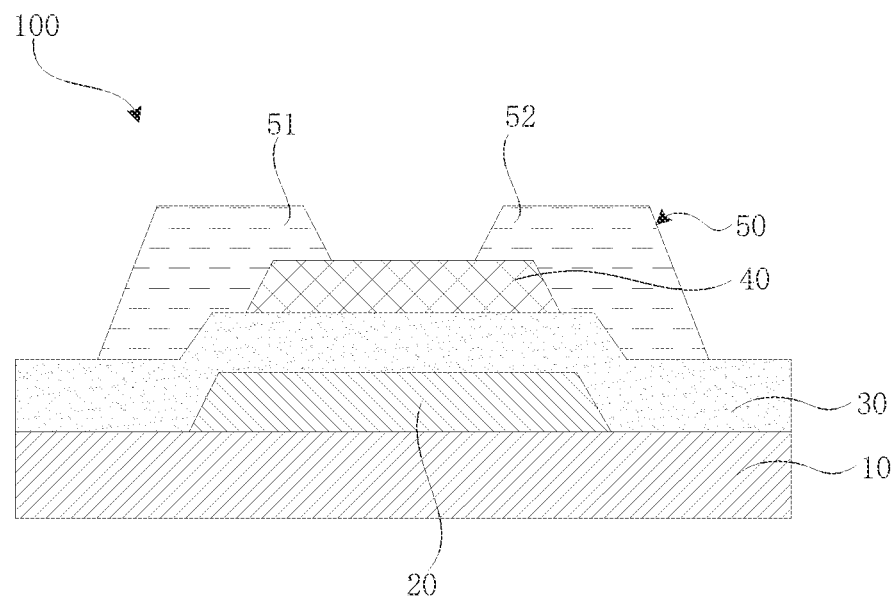
FIG. 1 is a schematic cross-sectional view of an array substrate in the prior art.

100, array substrate; 10, substrate; 20, gate; 30, gate insulating layer; 301, first sub-layer; 301a, recess; 302, second sub-layer; 40, oxide semiconductor layer; 50, source-drain metal layer; 51, source; 52, drain; 60, source-drain insulating layer; 200, passivation layer; 200a, via hole; 300, pixel electrode; 400, opposite substrate.

DETAILED DESCRIPTION

The technical solutions in the embodiments of the present disclosure will be clearly and completely described below with reference to the accompanying drawings in the embodiments of the present disclosure. Obviously, the described embodiments are only some, but not all, embodiments of the present disclosure. Based on the embodiments in the present disclosure, all other embodiments obtained by those skilled in the art without creative efforts shall fall within the protection scope of the present disclosure. Furthermore, it should be understood that the specific embodiments described herein are only used to illustrate and explain the present disclosure, and not to limit the present disclosure. In the present disclosure, unless specified otherwise, orientation terms such as "up" and "low" are used generally to refer to upper and lower in the actual use or operating state of the device, specifically the direction of the drawing in the drawings; while "inner" and "outer" refer to the outline of the device.

Referring to FIG. 1, which is a schematic cross-sectional view of an array substrate in the prior art. The array substrate 100 in the prior art includes a substrate 10, a gate 20, a gate insulating layer 30, an oxide semiconductor layer 40, and a source-drain metal layer 50. The gate insulating layer 30 is disposed between the gate 20 and the oxide semiconductor layer 40. The source-drain metal layer 50 includes a source 51 and a drain 52. Material of the gate insulating layer 30 is generally an inorganic insulating material such as silicon nitride or silicon oxide, and material of the oxide semiconductor layer 40 is generally a metal oxide material such as IGZO (indium gallium zinc oxide). Therefore, material compositions of the gate insulating layer 30 and the oxide semiconductor layer 40 are different, resulting in a higher density of defect states at a transition interface between the two, which in turn leads to lower device mobility and stability of the thin film transistor.

In view of this, embodiments of the present disclosure provide an array substrate 100. A difference from the array substrate 100 in the prior art is that material of an oxide semiconductor layer 40 of the array substrate 100 of the embodiments of the present disclosure includes an oxide of a first metal element. Moreover, material of at least a portion of a gate insulating layer 30 in contact with the oxide semiconductor layer 40 includes the oxide of the first metal element.

It can be understood that, in the embodiments of the present disclosure, the material of the oxide semiconductor layer 40 includes the first metal element, and the material of at least the portion of the gate insulating layer 30 in contact with the oxide semiconductor layer 40 includes the oxide of the first metal element. Since the gate insulating layer 30 and the oxide semiconductor layer 40 have the same composition at a transition interface therebetween, the transition interface has a lower density of defect states. In the prior art, since the gate insulating layer 30 and the oxide semiconductor layer 40 have different materials, more defect states are generated at the transition interface when the two are in direct contact. The above situation is prevented, which is beneficial to improve the mobility and stability of the thin film transistor.

It should be noted that the thin film transistors may be top-gate thin film transistors or bottom-gate thin film transistors. In order to clearly describe the technical solution provided by the present disclosure, the embodiments of the present disclosure focus on taking the thin film transistors as an example of the bottom-gate thin film transistors for illustration and description. However, the top-gate thin film transistors adopting the concept of the application provided by the present disclosure also falls within the protection scope of the present disclosure.

Figure 2:
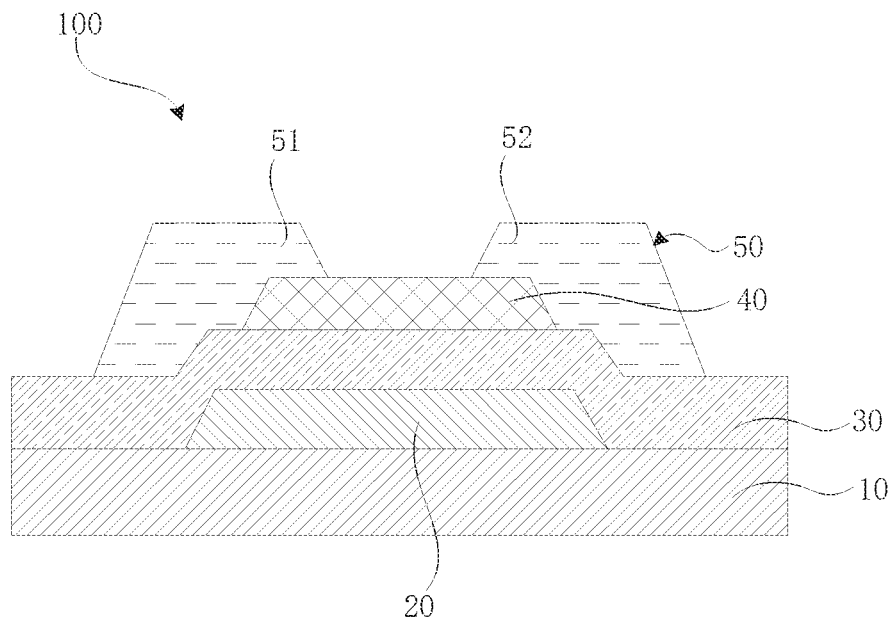
FIG. 2 is a schematic cross-sectional view of a first array substrate of an embodiment of the present disclosure.

In one embodiment, as shown in FIG. 2, FIG. 2 is a schematic cross-sectional view of a first array substrate of an embodiment of the present disclosure. Thin film transistors may be bottom-gate thin film transistors. Specifically, the array substrate 100 includes a substrate 10, a gate 20, a gate insulating layer 30, an oxide semiconductor layer 40, and a source-drain metal layer 50. The gate 20, the gate insulating layer 30, the oxide semiconductor layer 40, and the source-drain metal layer 50 are disposed on the substrate 10. The gate 20, the gate insulating layer 30, the oxide semiconductor layer 40, and the source-drain metal layer 50 are sequentially stacked in a direction away from the substrate 10. Specifically, the gate 20 is disposed on a side of the substrate 10. The gate insulating layer 30 covers a side of the gate 20 away from the substrate 10. The oxide semiconductor layer 40 is disposed on a side of the gate insulating layer 30 away from the substrate 10. The source-drain metal layer 50 is disposed on a side of the oxide semiconductor layer 40 away from the substrate 10. The source-drain metal layer 50 includes a source 51 and a drain 52.

In this embodiment, a difference between FIG. 2 and FIG. 1 is that material of all portions of the gate insulating layer 30 is an oxide of the first metal element. The gate insulating layer 30 can be formed by only one process. Simply put, in this embodiment, the material of the gate insulating layer 30 in the prior art is replaced with the oxide of the first metal element. A transition interface between the gate insulating layer 30 and the oxide semiconductor layer 40 has the same material composition. In the prior art, when the gate insulating layer 30 and the oxide semiconductor layer 40 are in direct contact, many defect states are generated at the transition interface. The above situation is prevented.

Specifically, the first metal element includes one of aluminum Al, hafnium Hf, titanium Ti, zirconium Zr, praseodymium Pr, and lanthanum La. Correspondingly, the material of the gate insulating layer 30 includes one of aluminum oxide ($Al_2O_3$), hafnium oxide ($HfO_2$), titanium oxide ($TiO_2$), zirconium oxide ($ZrO_2$), praseodymium oxide ($Pr_6O_{11}$), and lanthanum oxide ($La_2O_3$). The material of the oxide semiconductor layer 40 includes one of aluminum oxide ($Al_2O_3$), hafnium oxide ($HfO_2$), titanium oxide ($TiO_2$), zirconium oxide ($ZrO_2$), praseodymium oxide ($Pr_6O_{11}$), and lanthanum oxide ($La_2O_3$).

Preferably, the first metal element is aluminum, and the material of the gate insulating layer 30 is aluminum oxide.

Specifically, in this embodiment, the material of the gate insulating layer 30 includes One of aluminum oxide ($Al_2O_3$), hafnium oxide ($HfO_2$), titanium oxide ($TiO_2$), zirconium oxide ($ZrO_2$), praseodymium oxide ($Pr_6O_{11}$), and lanthanum oxide ($La_2O_3$).

Furthermore, the oxide semiconductor layer 40 further includes a second metal element and a third metal element. The first metal element, the second metal element, and the third metal element are different metal elements. Alternatively, the second metal element is one of indium In, gallium Ga, zinc Zn, and tin Sn. The third metal element is one of indium In, gallium Ga, zinc Zn, and tin Sn.

Generally, the material of the oxide semiconductor layer 40 in the prior art is a metal oxide material such as IGZO, and specifically includes four elements of indium In, gallium Ga, zinc Zn, and oxygen O. Since indium In is expensive, in the embodiments of the present disclosure, the first metal element may replace indium In. That is, the second metal element is one of gallium Ga, zinc Zn, and tin Sn. The third metal element is one of gallium Ga, zinc Zn, and tin Sn. On the premise that properties of the oxide semiconductor layer 40 are not affected, the cost can be greatly reduced.

Specifically, in the embodiment, the first metal element is aluminum Al, the second metal element is gallium Ga, and the third metal element is zinc Zn. Molar contents of the aluminum Al, the gallium Ga, and the zinc Zn satisfy following relationships:

$$0.1 \leq Al/(Al+Ga+Zn) \leq 0.5$$

$$0.2 \leq Ga/(Al+Ga+Zn) \leq 0.4$$

$$0.3 \leq Zn/(Al+Ga+Zn) \leq 0.5$$

Specifically, material of the substrate 10 includes a glass substrate 10. Material of the gate 20 includes gold (Au), silver (Ag), copper (Cu), nickel (Ni), platinum (Pt), palladium (Pd), aluminum (Al), molybdenum (Mo), or chromium (Cr) of single or multiple layers. Material of the source-drain metal layer 50 includes molybdenum, copper, and a molybdenum-copper alloy.

Figure 3:
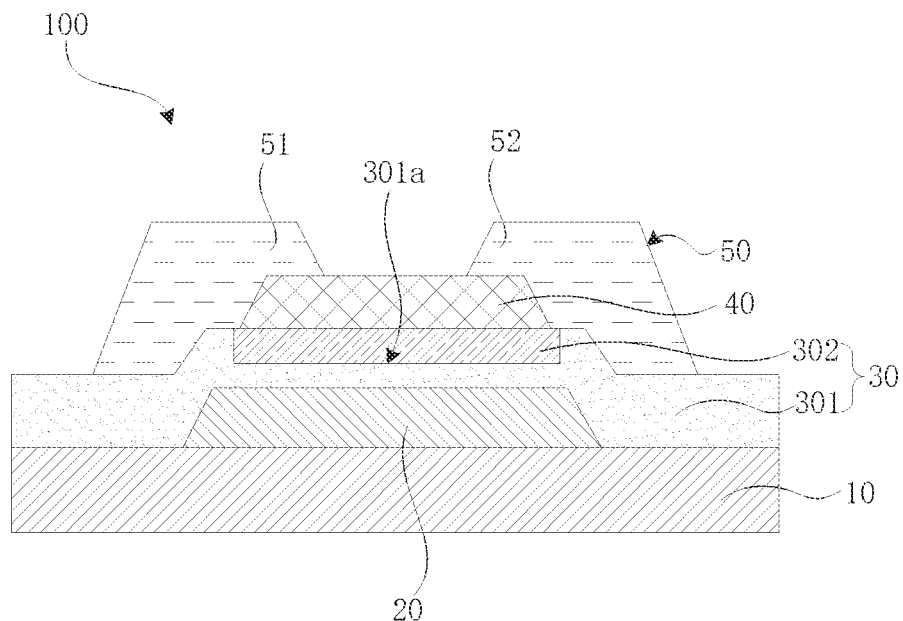
FIG. 3 is a schematic cross-sectional view of a second array substrate of an embodiment of the present disclosure.
Figure 4:
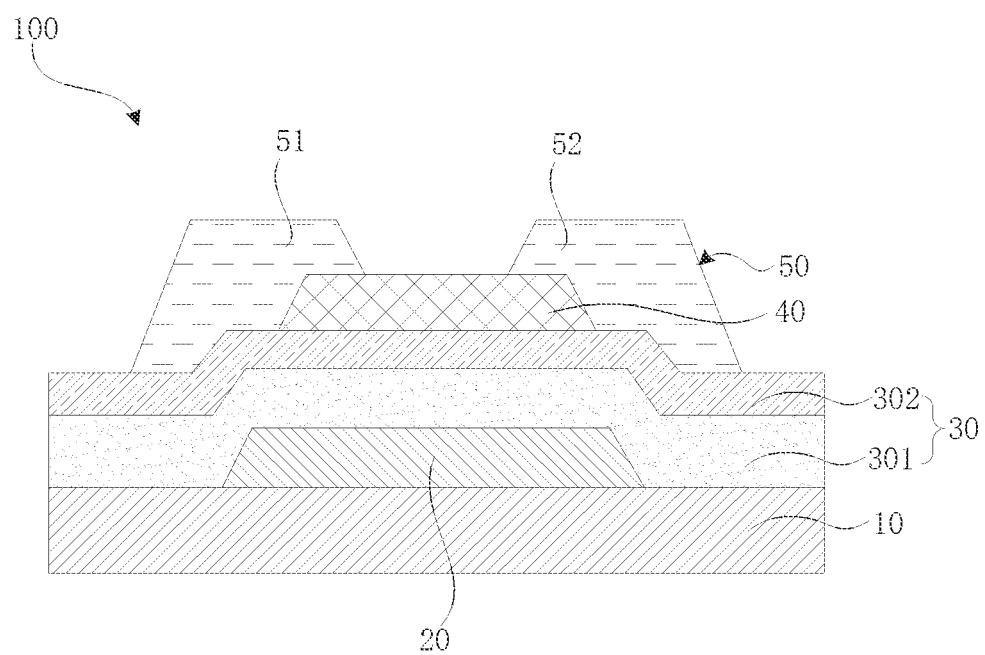
FIG. 4 is a schematic cross-sectional view of a third array substrate of an embodiment of the present disclosure.
Figure 5:
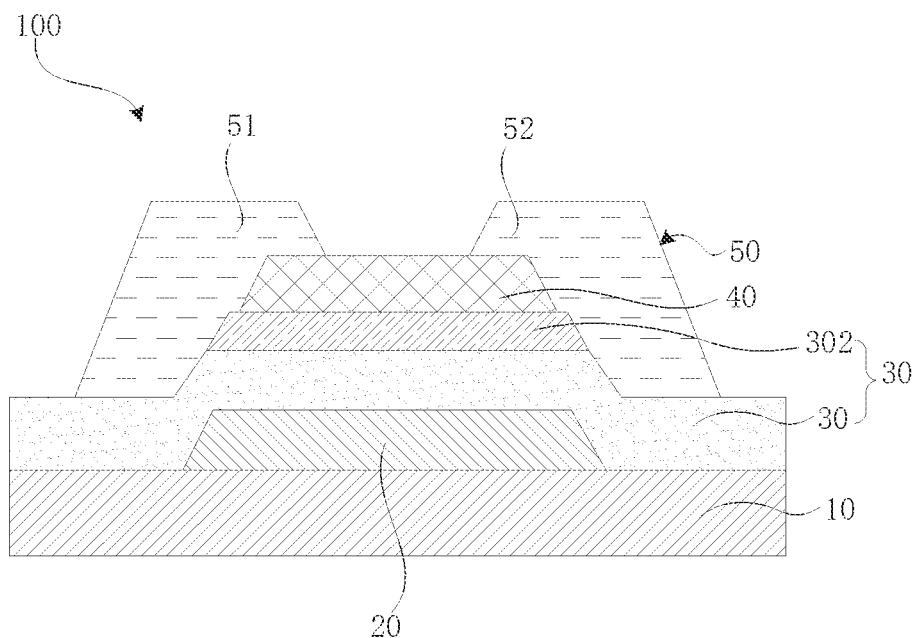
FIG. 5 is a schematic cross-sectional view of a fourth array substrate of an embodiment of the present disclosure.

In another embodiments, refer to FIG. 3, FIG. 4, and FIG. 5, FIG. 3 is a schematic cross-sectional view of a second array substrate of an embodiment of the present disclosure, FIG. 4 is a schematic cross-sectional view of a third array substrate of an embodiment of the present disclosure, and FIG. 5 is a schematic cross-sectional view of a fourth array substrate of an embodiment of the present disclosure. FIG. 3, FIG. 4, and FIG. 5 are different from FIG. 2 in that only a portion of the gate insulating layer 30 is made of the oxide of the first metal element, and the material of the rest of the gate insulating layer 30 is a different material from the oxide of the first metal element. Alternatively, the material of the rest of the gate insulating layer 30 is the same as the material of the gate insulating layer 30 in the prior art.

To put it simply, in this embodiment, on a basis of the gate insulating layer 30 in the prior art, the portion of the material of the gate insulating layer 30 is replaced with the oxide of the first metal element. Alternatively, an additional film layer is added on the basis of maintaining the gate insulating layer 30 in the prior art. The two layers together constitute the gate insulating layer 30 in the embodiments of the present disclosure. The material of the film layer is the oxide of the first metal element, so that the transition interface between the gate insulating layer 30 and the oxide semiconductor layer 40 has the same material composition, thereby reducing the defect states at the transition interface.

Specifically, the gate insulating layer 30 includes a first sub-layer 301 and a second sub-layer 302 which are connected to each other. The first sub-layer 301 is disposed on a side of the gate 20 close to the oxide semiconductor layer 40. The second sub-layer 302 is disposed between the first sub-layer 301 and the oxide semiconductor layer 40. An orthographic projection of the second sub-layer 302 on the substrate 10 covers an orthographic projection of the oxide semiconductor layer 40 on the substrate 10. Materials of the first sub-layer 301 and the second sub-layer 302 are different, and the material of the second sub-layer 302 is the oxide of the first metal element.

It can be understood that since the material of the second sub-layer 302 and the material of the oxide semiconductor layer 40 are both the oxide of the first metal element, the material of the second sub-layer 302 is the same as the material of the oxide semiconductor layer 40. Also, since the second sub-layer 302 is in direct contact with the oxide semiconductor layer 40, the transition interface between the second sub-layer 302 and the oxide semiconductor layer 40 has a lower density of defect states. It is beneficial to improve the mobility and stability of thin film transistors in the array substrate 100.

In this embodiment, the material of the first sub-layer 301 is different from the material of the second sub-layer 302. That is, the first sub-layer 301 and the second sub-layer 302 are two different film layers. The first sub-layer 301 and the second sub-layer 302 are correspondingly formed through different processes.

Specifically, the material of the first sub-layer 301 includes at least one of silicon nitride, silicon oxide, and silicon oxynitride. In this embodiment, the material of the gate insulating layer 30 is silicon nitride. The material of the second sub-layer 302 includes one of aluminum oxide ($Al_2O_3$), hafnium oxide ($HfO_2$), titanium oxide ($TiO_2$), zirconium oxide ($ZrO_2$), praseodymium oxide ($Pr_6O_{11}$), and lanthanum oxide ($La_2O_3$). In other embodiments, the gate insulating layer 30 may also be silicon nitride and silicon oxide which are stacked in layers.

Similarly, in this embodiment, the orthographic projection of the second sub-layer 302 on the substrate 10 covers the orthographic projection of the oxide semiconductor layer 40 on the substrate 10 to ensure that the oxide semiconductor layer 40 is completely formed on the second sub-layer 302. There is no direct contact between the oxide semiconductor layer 40 and the first sub-layer 301, thereby preventing defect states from being generated between the oxide semiconductor layer 40 and the first sub-layer 301. Furthermore, the defect states are prevented from being generated between the oxide semiconductor layer 40 and the gate insulating layer 30.

Specifically, as shown in FIG. 3, the first sub-layer 301 includes a recess 301a formed on a side of the first sub-layer 301 away from the substrate. At least a portion of the recess 301a is arranged corresponding to the oxide semiconductor layer 40. The second sub-layer 302 is filled in the recess 301a. It should be noted that the "corresponding arrangement" here means that the recess 301a and the oxide semiconductor layer 40 at least partially overlap in a stacking direction.

In this embodiment, there is a certain distance between a bottom of the recess 301a and the side of the gate 20 away from the substrate 10. This prevents the gate 20 from being damaged when the recess 301a is formed by a yellow light process, thereby affecting a performance of the thin film transistor.

Specifically, a cross-sectional shape of the recess 301a may be one of a rectangle, a trapezoid, and an inverted triangle, which is not limited by the present disclosure.

Specifically, a thickness of the second sub-layer 302 ranges from 5 nanometers to 1 micrometer. The thickness of the second sub-layer 302 cannot be set too large or too small. If the thickness is too small, the second sub-layer 302 is likely to be broken down, and the effect of reducing the defect states of the transition interface between the gate insulating layer 30 and the oxide semiconductor layer 40 cannot be achieved. If the thickness is too large, the overall thickness of the array substrate 100 will increase, which is not conducive to the thinning of products.

As shown in FIG. 4 and FIG. 5, a difference between FIG. 4 and FIG. 5 and FIG. 3 is that the second sub-layer 302 is disposed between the oxide semiconductor layer 40 and the first sub-layer 30, and the oxide semiconductor layer 40 is disposed on at least one side of the first sub-layer 301 away from the substrate 10.

As shown in FIG. 4, the second sub-layer 302 completely covers all portion of the first sub-layer 301. The second sub-layer 302 can be formed through only one manufacturing process, which is beneficial to reducing manufacturing processes and saving costs.

As shown in FIG. 5, a difference between FIG. 5 and FIG. 4 is that the second sub-layer 302 covers a portion of the first sub-layer 301. The orthographic projection of the second sub-layer 302 on the substrate 10 completely overlaps with the orthographic projection of the oxide semiconductor layer 40 on the substrate 10, which is beneficial to saving material costs.

Figure 6:
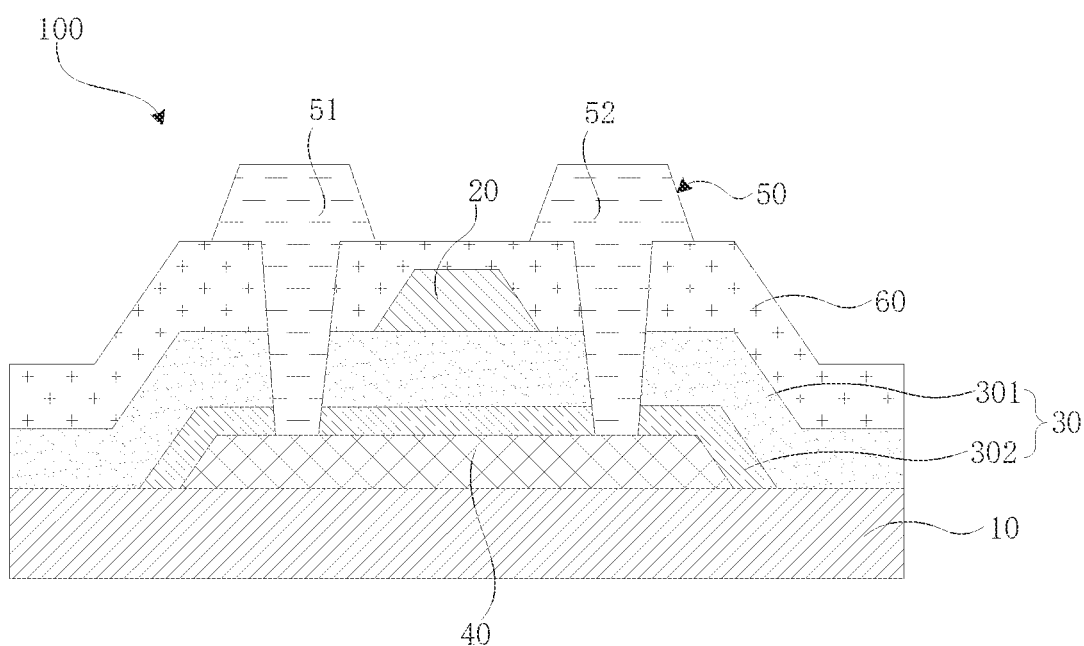
FIG. 6 is a schematic cross-sectional view of a fifth array substrate of an embodiment of the present disclosure.

Referring to FIG. 6, FIG. 6 is a schematic cross-sectional view of a fifth array substrate of an embodiment of the present disclosure. A thin film transistor may be a top-gate thin film transistor. The oxide semiconductor layer 40, the gate insulating layer 30, the gate 20, and the source-drain metal layer 50 are sequentially stacked in a direction away from the substrate. Specifically, the oxide semiconductor layer 40 is disposed on a side of the substrate 10. The gate insulating layer 30 covers a side of the oxide semiconductor layer 40 away from the substrate 10. The gate 20 is disposed on a side of the gate insulating layer 30 away from the substrate 10. The source-drain metal layer 50 is disposed on a side of the oxide semiconductor layer 40 away from the substrate 10. The source-drain metal layer 50 includes a source 51 and a drain 52. The array substrate 100 further includes a source-drain insulating layer 60 disposed between the source-drain metal layer 50 and the gate 20. The source 51 extends through via holes of the source-drain layer 60 and the gate insulating layer 30 and is electrically connected to the oxide semiconductor layer 40. The drain 52 extends through another via holes of the source-drain insulating layer 60 and the gate insulating layer 30 and is electrically connected to the oxide semiconductor layer 40.

Similarly, in this embodiment, the material of the oxide semiconductor layer 40 includes the oxide of the first metal element, and the material of a portion of the gate insulating layer 30 in contact with the oxide semiconductor layer 40 is the oxide of the first metal element. Since the gate insulating layer 30 and the oxide semiconductor layer 40 have the same composition at the transition interface therebetween, the transition interface has a lower density of defect states, which is beneficial to improve the mobility and stability of the thin film transistor.

Specifically, the gate insulating layer 30 may also include a first sub-layer 301 and a second sub-layer 302 which are connected to each other. The first sub-layer 301 is disposed on a side of the gate 20 close to the oxide semiconductor layer 40. The second sub-layer 302 is disposed between the first sub-layer 301 and the oxide semiconductor layer 40. The orthographic projection of the second sub-layer 302 on the substrate 10 covers the orthographic projection of the oxide semiconductor layer 40 on the substrate 10. At least a portion of the second sub-layer 302 is in contact with the oxide semiconductor layer 40. The materials of the first sub-layer 301 and the second sub-layer 302 are different, and the material of the second sub-layer 302 is oxide of the first metal element.

For example, refer to Table 1. In order to clearly illustrate technical solutions provided by the present disclosure, the applicant takes the first metal element being aluminum Al, the second metal element being gallium Ga, and the third metal element being zinc Zn as an example. The technical solutions provided by the embodiments of the present disclosure have been experimentally verified, and the specific experimental results are now described as follows:

It should be noted that in the process of experimental verification, it is necessary to control the manufacturing process, environmental conditions, and measurement methods to be consistent. The mobility of the finally formed thin film transistor is measured by changing the composition and proportion (target composition) of the metal element in the oxide semiconductor layer 40.

It can be seen from the Ref in Table 1 that when the material of the oxide semiconductor layer 40 in the prior art includes three metal elements of indium In, gallium Ga, and zinc Zn, and molar contents of indium In, gallium Ga, and zinc Zn satisfy the following relationships: $In/(In+Ga+Zn)=0.3$, $Ga/(In+Ga+Zn)=0.3$, and $Zn/(In+Ga+Zn)=0.4$, the device mobility of the thin film transistor is 8.3. When the material of the oxide semiconductor layer 40 includes three metal elements of aluminum Al, gallium Ga, and zinc Zn, the device mobility of the thin film transistor is all greater than 8.3. It can be seen that the technical solutions provided by the embodiments of the present disclosure can improve the mobility and stability of the thin film transistor.

In addition, Example 1, Example 2, Example 3, and Example 4 are compared. In Example 1, the molar contents of aluminum Al, gallium Ga, and zinc Zn in the oxide semiconductor layer 40 satisfy the following relationships:

$Al/(Al+Ga+Zn)=0.3$ $Ga/(Al+Ga+Zn)=0.3$ $Zn/(Al+Ga+Zn)=0.4$

At this time, the device mobility of the thin film transistor is 10.6.

In Example 2, the molar contents of aluminum Al, gallium Ga, and zinc Zn in the oxide semiconductor layer 40 satisfy the following relationships:

$Al/(Al+Ga+Zn)=0.4$ $Ga/(Al+Ga+Zn)=0.3$ $Zn/(Al+Ga+Zn)=0.4$

At this time, the device mobility of the thin film transistor is 16.

In Example 3, the molar contents of aluminum Al, gallium Ga, and zinc Zn in the oxide semiconductor layer 40 satisfy the following relationships:

$Al/(Al+Ga+Zn)=0.4$ $Ga/(Al+Ga+Zn)=0.3$ $Zn/(Al+Ga+Zn)=0.4$

At this time, the device mobility of the thin film transistor is 16.

In Example 4, the molar contents of aluminum Al, gallium Ga, and zinc Zn in the oxide semiconductor layer 40 satisfy the following relationships:

$Al/(Al+Ga+Zn)=0.1$ $Ga/(Al+Ga+Zn)=0.4$ $Zn/(Al+Ga+Zn)=0.5$

At this time, the device mobility of the thin film transistor is 2.3.

It can be seen that, as the molar content of aluminum Al in the oxide semiconductor layer 40 increases, the device mobility of the thin film transistor is improved. Therefore, the content of aluminum Al in the oxide semiconductor layer 40 can be set larger within an allowable range.

TABLE 1

|  | Ref | Example 1 | Example 2 | Example 3 | Example 4 |
| --- | --- | --- | --- | --- | --- |
| target composition | $In/(In+Ga+Zn)=0.3$ $Ga/(In+Ga+Zn)=0.3$ $Zn/(In+Ga+Zn)=0.4$ | $Al/(Al+Ga+Zn)=0.3$ $Ga/(Al+Ga+Zn)=0.3$ $Zn/(Al+Ga+Zn)=0.4$ | $Al/(Al+Ga+Zn)=0.4$ $Ga/(Al+Ga+Zn)=0.3$ $Zn/(Al+Ga+Zn)=0.3$ | $Al/(Al+Ga+Zn)=0.5$ $Ga/(Al+Ga+Zn)=0.2$ $Zn/(Al+Ga+Zn)=0.3$ | $Al/(Al+Ga+Zn)=0.1$ $Ga/(Al+Ga+Zn)=0.4$ $Zn/(Al+Ga+Zn)=0.5$ |
| Mobility (cm2/Vs) | 8.3 | 10.6 | 16 | 25 | 2.3 |

Figure 7:
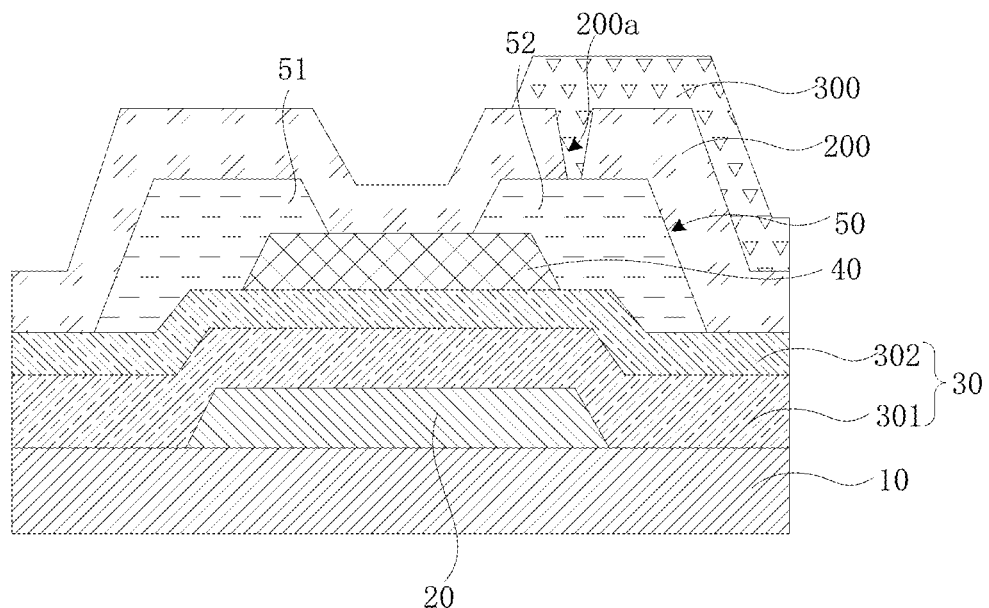
FIG. 7 is a schematic cross-sectional view of a sixth array substrate of an embodiment of the present disclosure.
Figure 8:
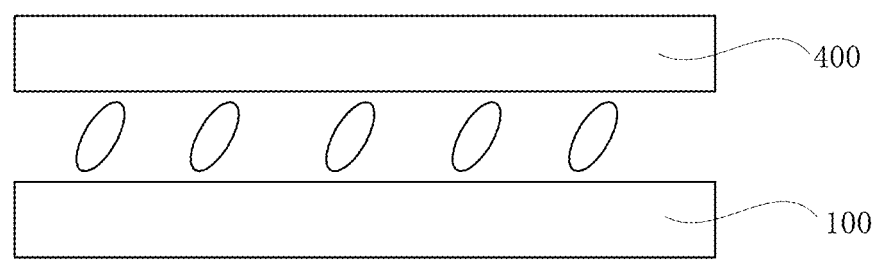
FIG. 8 is a schematic cross-sectional view of a display panel of an embodiment of the present disclosure.

Furthermore, refer to FIG. 7, FIG. 7 is a schematic cross-sectional view of a sixth array substrate of an embodiment of the present disclosure. The array substrate 10 of the embodiment of the present disclosure further includes a passivation layer 200 and a pixel electrode 300. The passivation layer 200 covers a side of the source-drain 52 of the metal layer 50 away from the substrate 10. The pixel electrode 300 is disposed on a side of the passivation layer 200 away from the substrate 10. The pixel electrode 300 is electrically connected to the source-drain 52 of the metal layer 50 through a via hole 200a extending through the passivation layer 200.

Specifically, material of the passivation layer 200 includes one or more combinations of silicon oxide, silicon nitride, and silicon oxynitride. Material of the pixel electrode 300 includes indium tin oxide.

Furthermore, an embodiment of the present disclosure also provides a display panel. The display panel includes an opposite substrate 400 and the array substrate 100 in the above embodiments. The opposite substrate 400 is relatively spaced apart from the array substrate 100.

Advantages are as follows. In the array substrate and the display panel of the present disclosure, the material of the oxide semiconductor layer includes the oxide of the first metal element, and the material of at least the portion of the gate insulating layer in contact with the oxide semiconductor layer includes the oxide of the first metal element. Since the gate insulating layer and the oxide semiconductor layer have the same composition at a transition interface therebetween, the transition interface has a lower density of defect states. In the prior art, since the gate insulating layer and the oxide semiconductor layer have different materials, direct contact between the two causes many defect states at the transition interface. The above situation is prevented, which is beneficial to improve the mobility and stability of the thin film transistor.

In conclusion, although the present disclosure has been disclosed above with preferred embodiments, the above preferred embodiments are not intended to limit the present disclosure. Various changes and modifications can be made by those of ordinary skill in the art without departing from the spirit and scope of the present disclosure. Therefore, the protection scope of the present disclosure is subject to the scope defined by the claims.

What is claimed is:

1. An array substrate, comprising a substrate, a gate, a gate insulating layer, an oxide semiconductor layer, and a source-drain metal layer, wherein the gate, the gate insulating layer, the oxide semiconductor layer, and the source-drain metal layer are disposed on the substrate, the gate insulating layer is disposed between the gate and the oxide semiconductor layer, and the gate, the gate insulating layer, the oxide semiconductor layer, and the source-drain metal layer are sequentially stacked in a direction away from the substrate;

wherein material of the oxide semiconductor layer comprises an oxide of a first metal element, material of at least a portion of the gate insulating layer in contact with the oxide semiconductor layer comprises the oxide of the first metal element, and the first metal element comprises one of aluminum, hafnium, titanium, zirconium, praseodymium, and lanthanum; and wherein the oxide semiconductor layer further comprises an oxide of a second metal element and an oxide of a third metal element, the first metal element is aluminum (Al), the second metal element is gallium (Ga), the third metal element is zinc (Zn), and molar contents of the aluminum (Al), the gallium (Ga), and the zinc (Zn) satisfy following relationships:

$0.1 \leq Al/(Al+Ga+Zn) \leq 0.5;$ $0.2 \leq Ga/(Al+Ga+Zn) \leq 0.4;$ $0.3 \leq Zn/(Al+Ga+Zn) \leq 0.5.$ 2. The array substrate according to claim 1, wherein material of all portions of the gate insulating layer is the oxide of the first metal element.

3. The array substrate according to claim 1, wherein the gate insulating layer comprises a first sub-layer and a second sub-layer connected to each other, the first sub-layer is disposed on a side of the gate facing the oxide semiconductor layer, the second sub-layer is disposed between the oxide semiconductor layer and the first sub-layer, and an orthographic projection of the second sub-layer on the substrate covers an orthographic projection of the oxide semiconductor layer on the substrate; and wherein material of the first sub-layer is different from material of the second sub-layer, and the material of the second sub-layer is the oxide of the first metal element.

4. The array substrate according to claim 3, wherein the first sub-layer comprises a recess formed on a side of the first sub-layer away from the substrate, the orthographic projection of the oxide semiconductor layer on the substrate covers an orthographic projection of the recess on the substrate, and the second sub-layer is filled in the recess.

5. The array substrate according to claim 3, wherein the oxide semiconductor layer is disposed on a side of at least a portion of the first sub-layer away from the substrate.

6. The array substrate according to claim 3, wherein the material of the first sub-layer comprises at least one of silicon nitride, silicon oxide, and silicon oxynitride.

7. The array substrate according to claim 3, wherein a thickness of the second sub-layer ranges from 5 nanometers to 1 micrometer.

8. An array substrate, comprising a substrate, a gate, a gate insulating layer, an oxide semiconductor layer, and a source-drain metal layer, wherein the gate, the gate insulating layer, the oxide semiconductor layer, and the source-drain metal layer are disposed on the substrate, and the gate insulating layer is disposed between the gate and the oxide semiconductor layer;

wherein material of the oxide semiconductor layer comprises an oxide of a first metal element, and material of at least a portion of the gate insulating layer in contact with the oxide semiconductor layer comprises the oxide of the first metal element; and wherein the oxide semiconductor layer further comprises an oxide of a second metal element and an oxide of a third metal element, the first metal element is aluminum (Al), the second metal element is gallium (Ga), the third metal element is zinc (Zn), and molar contents of the aluminum (Al), the gallium (Ga), and the zinc (Zn) satisfy following relationships:

$0.1 \leq Al/(Al+Ga+Zn) \leq 0.5;$ $0.2 \leq Ga/(Al+Ga+Zn) \leq 0.4;$ $0.3 \leq Zn/(Al+Ga+Zn) \leq 0.5.$ 9. The array substrate according to claim 8, wherein material of all portions of the gate insulating layer is the oxide of the first metal element.

10. The array substrate according to claim 8, wherein the gate insulating layer comprises a first sub-layer and a second sub-layer connected to each other, the first sub-layer is disposed on a side of the gate facing the oxide semiconductor layer, the second sub-layer is disposed between the oxide semiconductor layer and the first sub-layer, and an orthographic projection of the second sub-layer on the substrate covers an orthographic projection of the oxide semiconductor layer on the substrate; and wherein material of the first sub-layer is different from material of the second sub-layer, and the material of the second sub-layer is the oxide of the first metal element.

11. The array substrate according to claim 10, wherein the first sub-layer comprises a recess formed on a side of the first sub-layer away from the substrate, the orthographic projection of the oxide semiconductor layer on the substrate covers an orthographic projection of the recess on the substrate, and the second sub-layer is filled in the recess.

12. The array substrate according to claim 10, wherein the oxide semiconductor layer is disposed on a side of at least a portion of the first sub-layer away from the substrate.

13. The array substrate according to claim 10, wherein the material of the first sub-layer comprises at least one of silicon nitride, silicon oxide, and silicon oxynitride.

14. The array substrate according to claim 10, wherein a thickness of the second sub-layer ranges from 5 nanometers to 1 micrometer.

15. The array substrate according to claim 8, wherein the gate, the gate insulating layer, the oxide semiconductor layer, and the source-drain metal layer are sequentially stacked in a direction away from the substrate, or
the oxide semiconductor layer, the gate insulating layer, the gate, and the source-drain metal layer are sequentially stacked in the direction away from the substrate.

16. The array substrate according to claim 15, further comprising:
a passivation layer covering a side of the source-drain metal layer away from the substrate; and
a pixel electrode disposed on a side of the passivation layer away from the substrate, wherein the pixel electrode is electrically connected to the source-drain metal layer through a via hole extending through the passivation layer.

17. A display panel, comprising an opposite substrate and an array substrate, wherein the opposite substrate is relatively spaced apart from the array substrate; and
wherein the array substrate comprises a substrate, a gate, a gate insulating layer, an oxide semiconductor layer, and a source-drain metal layer, wherein the gate, the gate insulating layer, the oxide semiconductor layer, and the source-drain metal layer are disposed on the substrate, and the gate insulating layer is disposed between the gate and the oxide semiconductor layer; and
wherein material of the oxide semiconductor layer comprises an oxide of a first metal element, and material of at least a portion of the gate insulating layer in contact with the oxide semiconductor layer comprises the oxide of the first metal element; and
wherein the oxide semiconductor layer further comprises an oxide of a second metal element and an oxide of a third metal element, the first metal element is aluminum (Al), the second metal element is gallium (Ga), the third metal element is zinc (Zn), and molar contents of the aluminum (Al), the gallium (Ga), and the zinc (Zn) satisfy following relationships:

$0.1 \leq Al/(Al+Ga+Zn) \leq 0.5;$ $0.2 \leq Ga/(Al+Ga+Zn) \leq 0.4;$ $0.3 \leq Zn/(Al+Ga+Zn) \leq 0.5.$

* * * * *